United States Patent [19]

Haynos

[11] 3,849,880

[45] Nov. 26, 1974

[54] SOLAR CELL ARRAY

[75] Inventor: Joseph Gabrial Haynos, Rockville, Md.

[73] Assignee: Communications Satellite Corporation (Comsat), Washington, D.C.

[22] Filed: July 20, 1972

[21] Appl. No.: 273,578

Related U.S. Application Data

[63] Continuation-in-part of Ser. No. 883,993, Dec. 12, 1969, abandoned.

[52] U.S. Cl. .......................... 29/626, 29/572, 136/89

[51] Int. Cl. .......................... H05k 3/30

[58] Field of Search .......................... 29/624–627, 29/572, 577, 589, 591; 136/89; 174/68.5; 340/381

[56] References Cited

UNITED STATES PATENTS

| | | | |
|---|---|---|---|
| 2,962,539 | 11/1960 | Daniel | 136/89 |
| 2,989,575 | 6/1961 | Wallace | 136/89 |
| 3,040,416 | 6/1962 | Matlow et al. | 29/572 |
| 3,094,439 | 6/1963 | Mann et al. | 136/89 |
| 3,116,171 | 12/1963 | Nielsen et al. | 136/89 |
| 3,151,379 | 10/1964 | Escoffery | 29/572 |
| 3,200,468 | 8/1965 | Dahlberg | 29/589 |
| 3,330,700 | 7/1967 | Golub et al. | 29/591 |
| 3,346,419 | 10/1967 | Webb | 136/89 |
| 3,375,141 | 3/1968 | Julius | 136/89 |
| 3,434,204 | 3/1969 | Grabbe | 29/589 X |
| 3,446,676 | 5/1969 | Webb | 136/89 |
| 3,459,597 | 8/1969 | Baron | 136/89 |
| 3,465,335 | 9/1969 | Russenberger | 340/381 |
| 3,494,024 | 2/1970 | Bock et al. | 29/589 |
| 3,531,858 | 10/1970 | Lutz | 29/591 |
| 3,553,030 | 1/1971 | Lebrun | 136/89 |
| 3,565,719 | 2/1971 | Webb | 136/89 X |
| 3,571,915 | 3/1971 | Shirland | 29/572 |
| 3,575,721 | 4/1971 | Mann | 136/89 |
| 3,713,893 | 1/1973 | Shirland | 29/572 X |

*Primary Examiner*—Charles W. Lanham
*Assistant Examiner*—Joseph A. Walkowski
*Attorney, Agent, or Firm*—Sughrue, Rothwell, Mion, Zinn & Macpeak

[57] ABSTRACT

Individual solar cells are placed bottom down on pre-printed areas of a substrate by means of an adhesive. The adhesive does not cover the entire bottom of the solar cell but leaves at least a region of the bottom of each cell which is to be welded to an interconnector free from adhesive. The substrate is pre-punched to have apertures therein at positions corresponding to the positions of contact between an interconnector and the bottom electrode of each cell. Thin electrical interconnectors are slid into position, each interconnector touching the top electrode of at least one cell and the bottom electrode of at least one adjacent cell. The interconnectors are welded directly to the top electrodes and through the pre-punched apertures to the bottom electrodes. Additional holding of the cells to the substrate is provided by button-type chemical/mechanical fasteners which extend from the bottom electrodes through additional pre-punched holes in the substrate and have sider regions below the substrate to mechanically and adhesively hold the substrate to the cells.

14 Claims, 8 Drawing Figures

PATENTED NOV 26 1974

3,849,880

SHEET 1 OF 2

SOLAR CELL ARRAY

CROSS-REFERENCE TO RELATED APPLICATIONS

This application is a continuation-in-part of U.S. Pat. application Ser. No. 883,993, filed Dec. 12, 1969, and now abandoned.

BACKGROUND OF THE INVENTION

The present invention is a simplified method of assembling solar cell arrays and the array resulting therefrom.

A solar cell array comprises a plurality of individual cells and interconnector means for electrically connecting adjacent cells in a matrix. Typically, the individual cells are arranged in columns and rows and the interconnector means are positioned to connect all cells in the same column in parallel circuit arrangement, and to connect all cells in the same row in series circuit connection. Each interconnector means is welded to the top electrodes of all cells in one column, and to the bottom electrodes of all cells in the adjacent column.

The standard method of forming the cells into an array of the type described begins with the step of aligning the cells in the rows and columns. This is done on an alignment and spacing jig. The metallic interconnectors are attached to the cell electrodes by soldering or welding. Since each interconnector extends from the top electrode of a first column of cells to the bottom electrode of a second column of cells, there is a lot of handling and movement of individual cells in order to properly index or position the cells and to complete the soldering or welding.

The electrical series-parallel cell matrix having been formed, it is necessary to attach the cell matrix to a rigid or flexible substrate. To accomplish that step, the cell matrix is lifted from the jig and placed onto the substrate which has been coated with a thick enough layer of adhesive to ensure adherence of the cell matrix to the substrate under operating conditions. Since the matrix is moved, there must be some means to hold the cells together in the matrix. This function is accomplished by the electrical interconnecting means, but in order for the interconnecting means to provide sufficient mechanical stability, the interconnecting means must be much bulkier than would be required to merely carry out the electrical function thereof.

There are a number of disadvantages of having relatively bulky interconnecting means. They more readily transmit stresses that are imposed on the array during vibration or internal shock. There is additional stress at the interface of a cell and interconnector caused by the large difference of thermal expansion of the cell material, such as silicon, and the interconnector material, such as silver or copper. The magnitude of the stress is directly proportional to the ratio of the cross-sectional area of the materials that are joined.

The method of placing the matrix on the substrate usually results in adhesive flowing to positions to adhere the interconnecting means to the substrate. Thus, any stresses experienced by the substrate are directly transferred to the interconnector. The thick adhesive layer reduces the flexibility of the array because of the added difficulty of bending a bulk of adhesive. Also, repairability of arrays is difficult, because the substrate has to be cut in order to repair broken interconnectors.

SUMMARY OF THE INVENTION

In accordance with the present invention, a solar cell array is formed which is free from the disadvantages mentioned above. There is very little handling of the individual cells and no handling of an interconnector matrix without a substrate attached thereto. The interconnectors need not provide any mechanical holding function and only need be large enough to carry out the necessary electrical interconnection function. The thick layer of adhesive is eliminated thereby increasing the flexibility of the array. No adhesive covers the interconnectors and the interconnections can be repaired without cutting the substrate.

All these advantages result from forming the array by a method which is simpler to carry out and requires less handling of the cells than the prior art method. A rigid or flexible substrate is first prepared by printing, or depressing, an outline of the positions of the cells in the array. Apertures are punched in the substrate in regions which correspond to the area of the bottom electrode that is to be welded to the interconnecting means. Each cell is placed in the pre-printed position of the substrate by means of an adhesive. The adhesive is placed to adhere the bottom of each cell to the substrate but is not placed in the region of the aforementioned apertures. The adhesive holds the cells to the substrate and retains them in their proper matrix positions. The interconnectors are inserted so as to extend from the top electrodes of one column of cells to the bottom electrodes of the adjacent column of cells. The interconnectors are then welded or soldered to the top electrodes. Next, the substrate with the cells thereon is turned over and the interconnectors are welded or soldered to the bottom electrodes through the apertures which are prepunched in the substrate. Unlike the prior art, the matrix arrangement of cells is never handled in the absence of the supporting substrate, and therefore the interconnectors may be extremely thin when compared with the interconnectors of the prior art.

An alternate feature of the invention is the addition of further holding means for securely holding the cells to the substrate. When this alternative feature is to be used, additional apertures are pre-punched into each region of the substrate that is to receive an individual cell. Following the initial placement of each cell in its respective position, the substrate with cells thereon is turned over and a mask is placed on the substrate. The mask has apertures thereon which are larger than but communicate with the second group of apertures prepunched in the substrate. An adhesive, such as silicone, is pressed into the apertures of the mask and through the apertures of the substrate. The adhesive adheres firmly to the bottom of the cells and thus fastens the cells to the substrate in a manner similar to a button type fastener. After the adhesive cures, the mask is removed.

DETAILED DESCRIPTION OF THE DRAWINGS

Figures 1, 2, 3, 4:
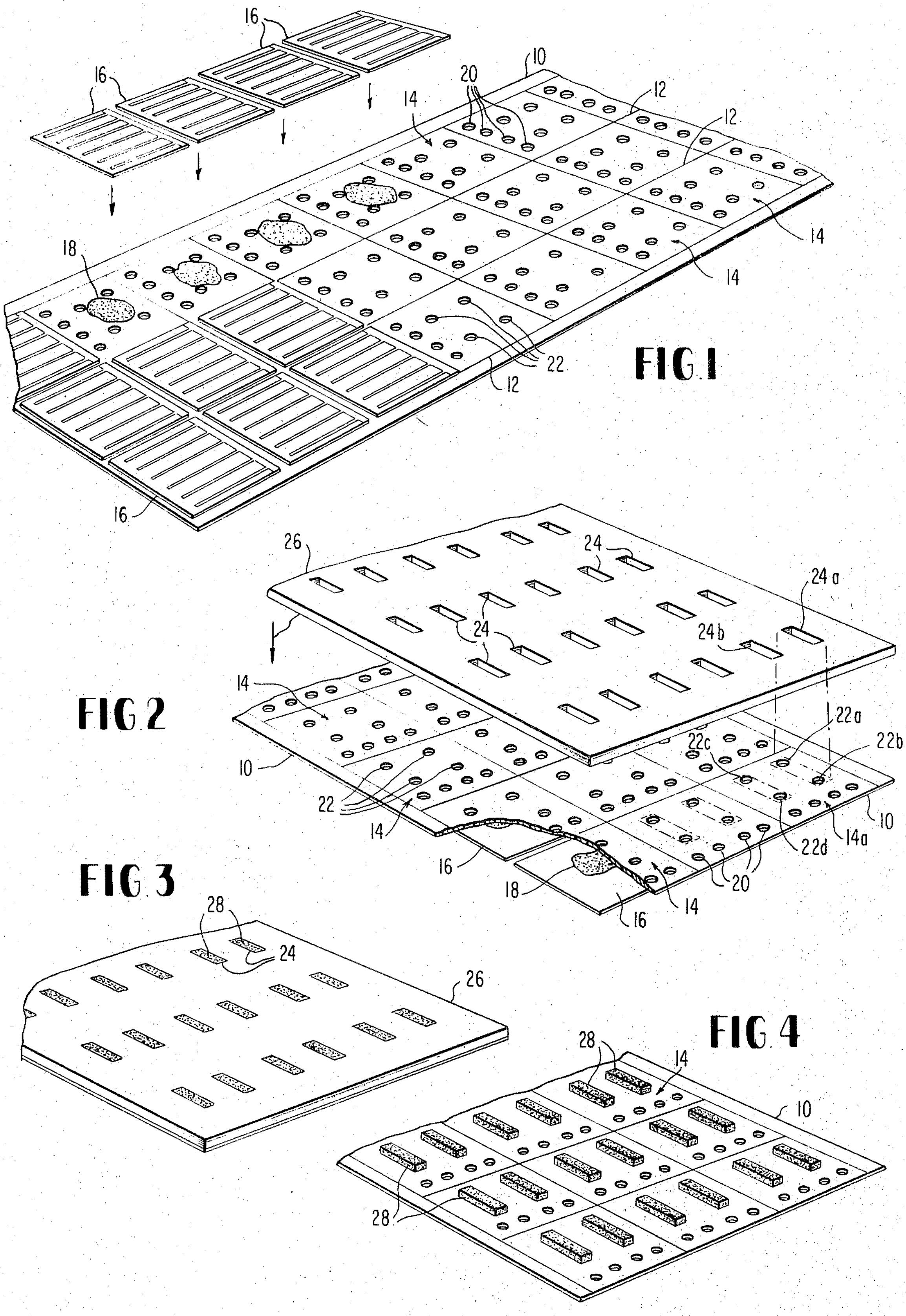
FIGS. 1–7 illustrate various steps in the process of forming a solar cell array in accordance with the present invention.

Referring to FIG. 1, there is shown a substrate 10 which has lines 12 pre-printed thereon by any known method. The lines 12 are pre-printed to form regions 14 arranged in columns and rows. Each region is of the same dimensions as the solar cells 16 which are to be placed on the regions. The solar cells 16 are any conventional solar cells having an electrode on the top surface and bottom surface. The substrate must be an insulating material and preferably is flexible at low temperatures, has high tensile strength, is radiation resistant, and has little or no outgasing. A preferred substrate is sold by Dupont Company under the trademark Kapton. The lines 12, which may simply be depressions formed in the substrate, are placed thereon merely to aid the fabricator in positioning the cells 16 onto the substrate. Although adjacent regions on the substrate are indicated as abutting, in actual practice there will be a small separation between adjacent regions 14.

Each region 14 in the substrate is provided with two groups of pre-punched apertures. The first group includes apertures 20 which, as will be explained more fully hereafter, are positioned to enable the interconnectors to be welded to the bottom electrodes of the cells. The second group includes apertures 22 which, as will be described more fully hereinafter, are positioned to enable the formation of a button type rubber adhesive holding member to be formed. The cells 16 are placed onto the respective regions and initially hold onto the substrate 10 by means of a pressure adhesive 18 such as silicone. The adhesive 18 may be placed either on the substrate or on the bottom of the cells initially, the difference not being material to the present invention. One important aspect of the placing of the adhesive 18 is that it must not be placed in the vicinity of the apertures 20.

After the cells 16 are properly positioned and held on the substrate 10, the substrate with the cells thereon is turned upside down as illustrated in FIG. 2 and a template or mask 26, preferably made of Teflon is placed over the substrate 10. The mask 26 has apertures 24 therein which communicate with apertures 22 in each of the regions 14. As illustrated in the drawing, aperture **24*a* overlies apertures 22*a* and 22*b* of region 14*a*, and aperture 24*b* overlies apertures 22*c* and 22*d* of region 14*a*. It should be noted that the particular arrangement illustrated in FIG. 2 is not critical. That is, the apertures in mask 26 may correspond 1 to 1 with the apertures in the substrate 10. The important features of the mask are that it includes apertures which communicate with and are larger than the apertures 22 of the regions 14**.

Figure 8:
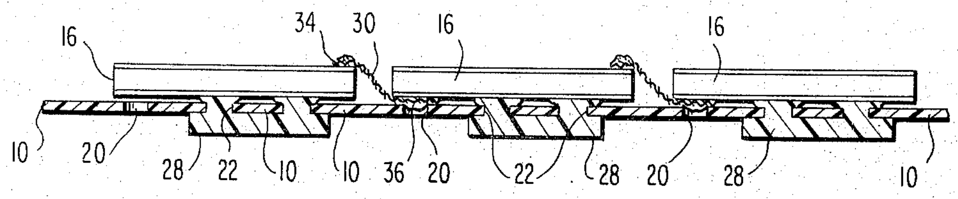
FIG. 8 is a cut-away sideview illustrating the relationship of cells, substrate, interconnectors and adhesive in an array formed by the method of FIGS. 1–7.

When the mask is in position, as illustrated in FIG. 3, an adhesive material 28, which is preferably a silicone rubber adhesive, is squeezed into the apertures 24 and therethrough to the apertures 22. When the adhesive cures, the mask 26 is removed, leaving rubbery fasteners 28, illustrated in FIG. 4, which extend through apertures 22 in substrate 10 and adhere firmly to the bottoms of the solar cells, and which mechanically hold the individual cells to the substrate 10. The relationship of the rubbery holding elements 28 to the substrate 10 and the cells 16 can be seen more readily in FIG. 8.

It should be noted that the purpose of the button type holding means 28 is to secure the cells to the preferable substrate material, Kapton, which does not adhere very strongly to most known adhesives. However, if a substrate material 10 and an adhesive 18 are used, which strongly adhere to each other, the holding means 28 may be dispensed with and the initial adhesive 18 may be sufficient to securely hold the cells to the substrate under operating conditions. In this case, the second group of apertures, i.e., apertures 22, may also be disposed with.

Figure 5:
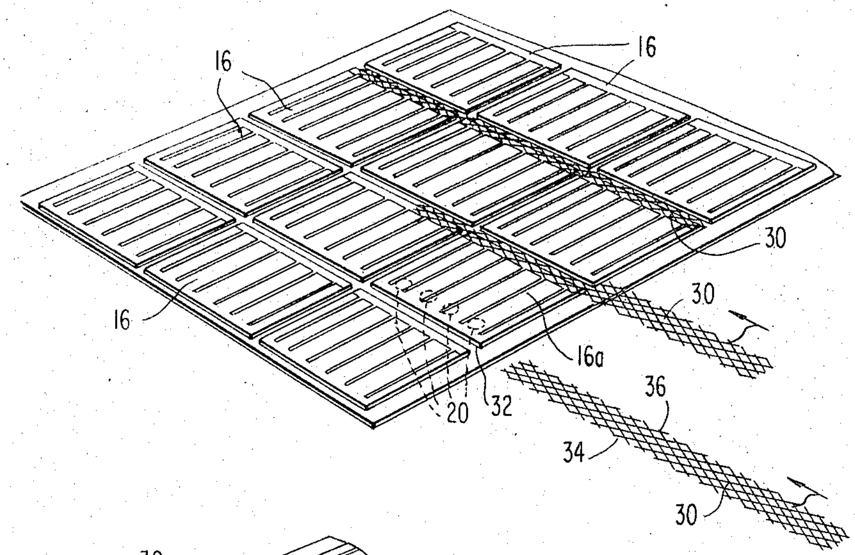

Following the previously described steps, the substrate with cells securely held thereto is turned right side up as illustrated in FIG. 5 and the metallic interconnectors 30 are inserted. Each metallic interconnector 30 is positioned so that left edge 34 overlies and touches the top electrodes of the cells 16 in one column and the right edge 36 underlies and touches the bottom electrodes of the cells in the adjacent column.

As will be recalled from the above description, no adhesive is placed in the vicinity of the first group of apertures 20. The relative position of the apertures 20 with respect to the particular cell **16*a* is illustrated in FIG. 5 by means of the phantom circles. Because of the position of the adhesive, the edge 32 of cells 16*a* may be lifted so that the edge 36 of interconnector 30 may be inserted underneath cell 16*a* between apertures 20** and the bottom electrode.

Figure 6:
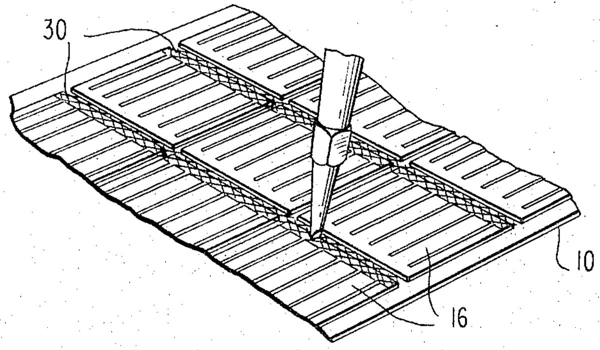
Figure 7:
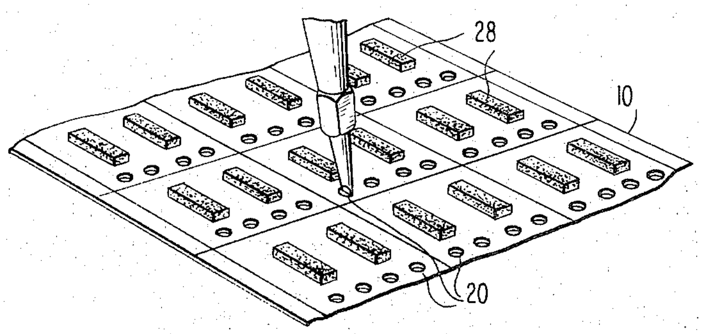

Next, the interconnectors 30 are welded or soldered to the upper electrodes as illustrated in FIG. 6. Then the substrate 10 with cells adhered thereto is turned upside down and the interconnectors 30 are welded to the bottom electrodes of the cells through the apertures 20 as illustrated in FIG. 7. A better view of the relationship of the interconnectors 30 and the apertures 20 can be seen in FIG. 8.

What is claimed is:

1. The method of forming a solar cell array comprising:

a. preparing an array substrate by forming a group of apertures in each region of said substrate on which a solar cell is to be placed, the position of each said group corresponding to the to-be-formed junction between a cell bottom electrode and an interconnector, b. adhering, by means of an adhesive, a plurality of cells bottom-down on said regions of said substrate to result in a matrix of cells adhered to said substrate, said adhesive being placed with respect to each said cell and region so as to leave said region in the vicinity of said group of apertures uncoated with said adhesive, c. placing electrical interconnectors between the top electrodes of the cells in each column of cells in said matrix and the bottom electrodes of the cells in one of the adjacent columns of cells, d. bonding said interconnectors to said top electrodes, and e. bonding, through said groups of apertures, said interconnectors to said bottom electrodes.

2. The method as claimed in claim 1, wherein said substrate is a flexible electrically non-conductive material.

3. The method as claimed in claim 1, wherein said adhesive is a pressure sensitive silicone adhesive.

4. The method as claimed in claim 1, wherein the steps of bonding comprise soldering the interconnectors to the electrodes.

5. The method as claimed in claim 1, wherein the steps of bonding comprise welding the interconnectors to the electrodes.

6. The method as claimed in claim 1, wherein the step of preparing said substrate comprises forming an outline of each said region on said substrate, each region having the same dimensions as said solar cells, and punching said apertures in each region adjacent one edge of each said region.

7. The method as claimed in claim 1, wherein the step of placing said interconnectors comprises inserting one end of said interconnectors between the portion of said region having said apertures therein and the portion of the bottom electrodes of said cells which overlie said apertures.

8. The method as claimed in claim 1, wherein the step of preparing said array substrate further comprises forming a second group of apertures, spaced away from the first said group of apertures, in each said region of said substrate.

9. The method as claimed in claim 8, further comprising forming chemical/mechanical holding means which extend through said second group of apertures and chemically adhere to the bottom of said cells at one end thereof and terminate in large volumes on the opposite side of said second group of apertures to mechanically hold said substrate to said cells.

10. The method as claimed in claim 9, wherein the step of forming said holding means comprises:

a. placing a mask on the surface of said substrate which is opposite the surface on which the cells are placed, said mask having apertures which communicate with and are larger than said second group of apertures, b. pressing an adhesive into said apertures in said mask to fill said second group of apertures and said mask apertures with adhesive, and c. removing said mask after said adhesive is allowed to cure.

11. The method as claimed in claim 9, wherein said substrate is a flexible insulating material.

12. The method as claimed in claim 9, wherein said adhesive is a pressure sensitive silicon adhesive.

13. The method as claimed in claim 9, wherein the steps of bonding comprise soldering the interconnectors to the electrodes.

14. The method as claimed in claim 9, wherein the steps of bonding comprise welding the interconnectors to the electrodes.

* * * * *

UNITED STATES PATENT OFFICE
CERTIFICATE OF CORRECTION

Patent No. 3,849,880 Dated November 26, 1974

Inventor(s) Joseph Gabrial HAYNOS

It is certified that error appears in the above-identified patent and that said Letters Patent are hereby corrected as shown below:

IN THE ABSTRACT:

Line 19 - "sider" should be -- wider --

IN THE SPECIFICATION:

Column 4, lines 10-11 - "disposed" should be -- dispensed --

Signed and sealed this 18th day of February 1975.

(SEAL)
Attest:

RUTH C. MASON
Attesting Officer

C. MARSHALL DANN
Commissioner of Patents
and Trademarks

FORM PO-1050 (10-69)
USCOMM-DC 60376-P69
U.S. GOVERNMENT PRINTING OFFICE : 869-930